US012414426B2

(12) United States Patent
Forrest (10) Patent No.: US 12,414,426 B2
(45) Date of Patent: Sep. 9, 2025

(54) ORGANIC PHOTOSENSITIVE DEVICES WITH REFLECTORS (71) Applicant: THE REGENTS OF THE UNIVERSITY OF MICHIGAN, Ann Arbor, MI (US)

(72) Inventor: Stephen R. Forrest, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 14/434,897

(22) PCT Filed: Oct. 11, 2013

(86) PCT No.: PCT/US2013/064444
§ 371 (c)(1),
(2) Date: Apr. 10, 2015

(87) PCT Pub. No.: WO2014/059217
PCT Pub. Date: Apr. 17, 2014

(65) Prior Publication Data
US 2015/0287945 A1 Oct. 8, 2015

Related U.S. Application Data (60) Provisional application No. 61/712,782, filed on Oct. 11, 2012.

(51) Int. Cl.
*H10K 30/87* (2023.01)
*H10K 30/80* (2023.01)
(Continued)

(52) U.S. Cl.
CPC ............ *H10K 30/87* (2023.02); *H10K 30/80* (2023.02); *H10K 30/81* (2023.02); *H10K 30/83* (2023.02); *H10K 77/111* (2023.02); *Y02E 10/549* (2013.01)

(58) Field of Classification Search
CPC ....... H01L 51/42–448; H01L 31/02162; H01L 31/02164; H01L 31/02154;
(Continued)

(56) References Cited

U.S. PATENT DOCUMENTS 5,400,174 A * 3/1995 Pagis ..................... G02B 5/285
359/359
2001/0011551 A1 8/2001 Peumans et al.
(Continued)

FOREIGN PATENT DOCUMENTS

CN 1900745 A 1/2007
CN 102695914 A 9/2012
(Continued)

OTHER PUBLICATIONS

Agrawal et al., "Broadband optical absorption enhancement through coherent light trapping in thin-film photovoltaic;" Optics Express, vol. 16. No. 8. pp. 6385-5918 (Apr. 2008).
(Continued)

Primary Examiner — Daniel P Malley, Jr.
(74) Attorney, Agent, or Firm — Finnegan, Henderson, Farabow, Garrett & Dunner, LLP (57) ABSTRACT The present disclosure relates to organic photosensitive devices comprising a substrate; a first electrode disposed over the substrate; a second electrode disposed over the first electrode; a photoactive region positioned between the first electrode and the second electrode; and at least one reflector disposed over the second electrode, wherein the at least one reflector is configured to at least partially reflect one or more desired wavelengths. Also disclosed are methods of preparing photosensitive devices having at least one reflector configured to at least partially reflect one or more desired wavelengths.

11 Claims, 4 Drawing Sheets (51) Int. Cl.
*H10K 30/81* (2023.01)
*H10K 30/83* (2023.01)
*H10K 77/10* (2023.01)

(58) Field of Classification Search
CPC ......... H01L 31/02168; H01L 31/02167; H01L 31/02327; H01L 31/054; H01L 31/0549; H01L 31/056; Y02E 10/549
USPC .................................................. 136/243–265
See application file for complete search history.

(56) References Cited

U.S. PATENT DOCUMENTS

| | | | |
|---|---|---|---|
| 2008/0302030 A1* | 12/2008 | Stancel | H01L 31/02008 52/173.3 |
| 2009/0159123 A1 | 6/2009 | Kothari et al. | |
| 2009/0242021 A1* | 10/2009 | Petkie | H01L 31/02168 136/256 |
| 2009/0287446 A1* | 11/2009 | Wang | H10F 19/80 438/73 |
| 2010/0096011 A1 | 4/2010 | Griffiths et al. | |
| 2013/0174900 A1* | 7/2013 | Farris, III | H01L 31/022466 977/890 |
| 2013/0312828 A1* | 11/2013 | Afify | H01L 31/02168 136/258 |

FOREIGN PATENT DOCUMENTS

| | | |
|---|---|---|
| TW | 200644066 A | 12/2006 |
| TW | 200939498 A | 9/2009 |
| TW | 201025623 A | 7/2010 |
| WO | WO2001/49475 A1 | 7/2001 |
| WO | WO2011/034908 | 3/2011 |
| WO | WO2011/044687 A1 | 4/2011 |

OTHER PUBLICATIONS

Galagan et al., "Semitransparent organic solar cells with organic wavelength dependent reflectors," American Institute of Physics, vol. 98, No. 4, pp. 43302-1-43302-3 (Jan. 2011).

Niggemann et al., "Light trapping In organic solar cells," Physica Status Solidi Sa, vol. 25, No. 12, pp. 2862-2874 (Nov. 2008).

Selim et al.. "Resonant cavity enhanced photonic devices," Journal of Applied Physics, vol. 78, No. 2, pp. 607-638 (Jan. 1995).

International Search Report and Written Opinion for PCT/US2013/064444 dated Feb. 24, 2014.

* cited by examiner

ORGANIC PHOTOSENSITIVE DEVICES WITH REFLECTORS

CROSS-REFERENCE TO RELATED APPLICATIONS

This application claims priority to U.S. Provisional Application No. 61/712,782 filed on Oct. 11, 2012, which is incorporated herein by reference in its entirety.

JOINT RESEARCH AGREEMENT

The subject matter of this application was made by, on behalf of, and/or in connection with one or more of the following parties to a joint university-corporation research agreement: The Regents of the University of Michigan and Global Photonic Energy Corporation. The agreement was in effect on and before the date the subject matter of this application was made, and such was made as a result of activities undertaken within the scope of the agreement.

The present disclosure relates to photosensitive devices. More specifically, the present disclosure is directed to photosensitive devices comprising a reflector configured to at least partially reflect one or more desired wavelengths. Also disclosed herein are methods for preparing photosensitive devices comprising a reflector configured to at least partially reflect one or more desired wavelengths.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. Typically, a photovoltaic cell provides power to a circuit, device or equipment. A photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max}V_{max}\}/\{I_{SC}V_{OC}\} \qquad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff*(I_{SC}*V_{OC})/P_{inc}$$

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In one embodiment, an acceptor material is an ETL and a donor material is a HTL.

Conventional inorganic semiconductor PV cells employ a p-n junction to establish an internal field. However, it is now recognized that in addition to the establishment of a p-n type junction, the energy level offset of the heterojunction also plays an important role. The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. Carrier generation requires exciton generation, diffusion and ionization or collection. There is an efficiency $\eta$ associated with each of these processes. Subscripts may be used as follows: P for power efficiency, EXT for external quantum efficiency, A for photon absorption exciton generation, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50\text{Å}$) than the optical absorption length (~500Å), requiring a tradeoff between using a thick, and therefore resistive, cell with multiple or highly folded interfaces, or a thin cell with a low optical absorption efficiency.

Conventional organic PV cells are fabricated on transparent substrates such as glass or plastic coated with a transparent conductor, such as indium tin oxide (ITO), to permit incoming incident electromagnetic radiation to reach the photoactive region. These substrates limit the application of organic PV devices, and because they can be expensive and/or an important element of the overall cost structure of the device, such substrates have the potential to limit the cost-effectiveness of the overall device, especially in large-area applications. Inverted organic PV cells utilize a transparent top electrode and allow for fabrication on arbitrary surfaces, such as metal foils, plastic, or glass. This design significantly extends the application of organic PV cells. For example, power-generating coatings of organic PV cells may be grown on a variety of substrate surfaces, including opaque substrates. Accordingly, there exists a need to develop efficient organic photosensitive devices, such as efficient power-generating PV coatings, of desired colors for application on a variety of substrates. More specifically, there exists a need to develop efficient power-generating coatings that at least partially reflect one or more desired wavelengths.

Thus, there is disclosed an organic photosensitive device comprising: a substrate; a first electrode disposed over the substrate; a second electrode disposed over the first electrode; a photoactive region positioned between the first electrode and the second electrode, wherein the photoactive region transmits light at wavelengths in a transparent range; and a reflector disposed over the second electrode, wherein the reflector is configured to at least partially reflect one or more desired wavelengths. In some embodiments, the photosensitive device exhibits a color corresponding to the one or more desired wavelengths.

In some embodiments, the photosensitive device further comprises a metal grid positioned between the second electrode and the reflector.

In a first aspect, the reflector and the first electrode define an optical microcavity, wherein the first electrode reflects 10% of incident light at one or more wavelengths, and the reflector is configured to partially reflect one or more desired wavelengths in the transparent range of the photoactive region. In some embodiments, the reflector exhibits a reflectivity less than 5% at any wavelength for which the photoactive region exhibits an absorptivity greater than 40%. In some embodiments, the optical microcavity includes an optical spacer positioned between the reflector and the second electrode, wherein the optical spacer has a thickness chosen to be resonant with the one or more desired wavelengths or a subset thereof. In some embodiments, the organic photosensitive device exhibits a color corresponding to the one or more desired wavelengths or a subset thereof. In some embodiments, the at least one reflector is chosen from a distributed Bragg reflector (DBR) and a rugate reflector.

In a second aspect, the reflector comprises at least one notch filter, wherein the at least one notch filter exhibits high reflectivity in a narrow reflection band at a range of one or more desired wavelengths. In some embodiments, the device further comprises an optical spacer positioned between the reflector and the second electrode. In some embodiments, the at least one notch filter is chosen from a DBR and a rugate reflector.

In some embodiments of the second aspect, the reflector comprises at least a first notch filter and a second notch filter, wherein the first notch filter is configured to exhibit high reflectivity in a narrow reflection band at a range of one or more first desired wavelengths, and the second notch filter is configured to exhibit high reflectivity in a narrow reflection band at a range of one or more second desired wavelengths. In this embodiment, the organic photosensitive device may exhibit a color corresponding to the one or more first desired wavelengths and the one or more second desired wavelengths. In some embodiments, the first and second notch filters are independently chosen from DBRs and rugate reflectors.

In a third aspect, the reflector comprises a first reflector and a second reflector, wherein the first reflector comprises at least one notch filter, the at least one notch filter configured to exhibit high reflectivity in a narrow reflection band at a range of one or more first desired wavelengths, and wherein the second reflector and the first electrode define an optical microcavity, wherein the first electrode reflects ≥10% of incident light at one or more wavelengths, and the second reflector is configured to partially reflect one or more second desired wavelengths in the transparent range of the photoactive region. In some embodiments, the reflector exhibits a reflectivity less than 5% at any wavelength for which the photoactive region exhibits an absorptivity greater than 40%. In some embodiments, the narrow reflection band at a range of one or more first desired wavelengths does not overlap with the one or more second desired wavelengths partially reflected by the second reflector.

In some embodiments of the third aspect, the optical microcavity includes an optical spacer positioned between the second reflector and the second electrode, wherein the optical spacer has a thickness chosen to be resonant with the one or more second desired wavelengths or a subset thereof. In some embodiments, the organic photosensitive device exhibits a color corresponding to the one or more desired reflected wavelengths or a subset thereof. In some embodiments, the at least one reflector is chosen from a distributed Bragg reflector (DBR) and a rugate reflector.

In some embodiments of the third aspect, the photosensitive device may exhibit a color corresponding to the one or more first desired wavelengths and the one or more second desired wavelengths or a subset thereof.

In some embodiments of the third aspect, the first and second reflectors are independently chosen from DBRs and rugate reflectors.

In some embodiments, the device is an organic photodetector.

In some embodiments, the device is an organic solar cell.

Also disclosed are methods of fabricating the organic photosensitive devices of the present disclosure. In one embodiment, the method comprises depositing a first electrode over a substrate; depositing a photoactive region over the first electrode; depositing a second electrode over the photoactive region; and depositing at least one reflector over the second electrode, wherein the at least one reflector is configured to reflect one or more desired wavelengths.

The accompanying figures are incorporated in, and constitute a part of this specification.

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be substantially transparent. The opposing electrode may be a reflective material so that light which has passed through the cell without being absorbed is reflected back through the cell.

The term "cathode" is used in the following manner. In a non-stacked PV device or a single unit of a stacked PV device under ambient irradiation and connected with a resistive load and with no externally applied voltage, e.g., a PV device, electrons move to the cathode from the photoconducting material.

Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

As used herein, a layer of material or a sequence of several layers of different materials is said to be "transparent" when the layer or layers permit at least about 50% of the ambient electromagnetic radiation in relevant wavelengths to be transmitted through the layer or layers. Similarly, layers which permit some, but less than about 50% transmission of ambient electromagnetic radiation in relevant wavelengths are said to be "semi-transparent."

As used herein, "top" means furthest away from the substrate structure (if present), while "bottom" means closest to the substrate structure. For example, for a device having two electrodes, the bottom electrode is the electrode closest to the substrate structure, and is generally the first electrode fabricated. The bottom electrode has two surfaces, a bottom side closest to the substrate, and a top side further away from the substrate. Where a first layer is described as "disposed over" or "on top of" a second layer, the first layer is disposed further away from substrate. There may be other layers between the first and second layer, unless it is specified that the first layer is "in physical contact with" the second layer. For example, a cathode may be described as "disposed over" or "on top of" an anode, even though there are various organic layers in between.

As used herein, the term "optical microcavity" means an optical zone whose dimensions along the direction of light propagation are on the order of at no more than a few (~4) wavelengths of the incident radiation.

As used herein, the term "reflectivity" refers to the percentage of incident light at a given wavelength that is reflected. A "high reflectivity" is defined as a reflectivity greater than 30%.

As used herein, the term "absorptivity" refers to the percentage of incident light at a given wavelength that is absorbed.

As used herein, the term "transmissivity" refers to the percentage of incident light at a given wavelength that is transmitted.

The organic photosensitive optoelectronic devices described herein may be used, for example, to generate a usable electrical current from incident electromagnetic radiation (e.g., PV devices) or may be used to detect incident electromagnetic radiation. Inverted photosensitive optoelectronic devices allow for the fabrication of device materials on arbitrary substrates and surfaces. Inverted device structures are disclosed, for example, in U.S. Patent Publication No. 2010/0102304, which is incorporated herein by reference for its disclosure of inverted organic photosensitive devices. This design significantly extends the application of organic photosensitive devices, such as allowing for the fabrication of power-generating coatings, e.g., a power-generating paint, on flexible and opaque substrates. In the present disclosure, in order for the power-generating coating to exhibit a desired color, an organic photosensitive device includes at least one reflector configured to at least partially reflect one or more desired wavelengths. Because the reflector can potentially reduce the amount of incident light absorbed by the photoactive region of an organic photosensitive device, such as an organic PV device, the present disclosure contemplates design considerations that allow for high reflectivity at desired wavelengths (i.e., colors) while minimizing reduction of device efficiency.

Figure 1:
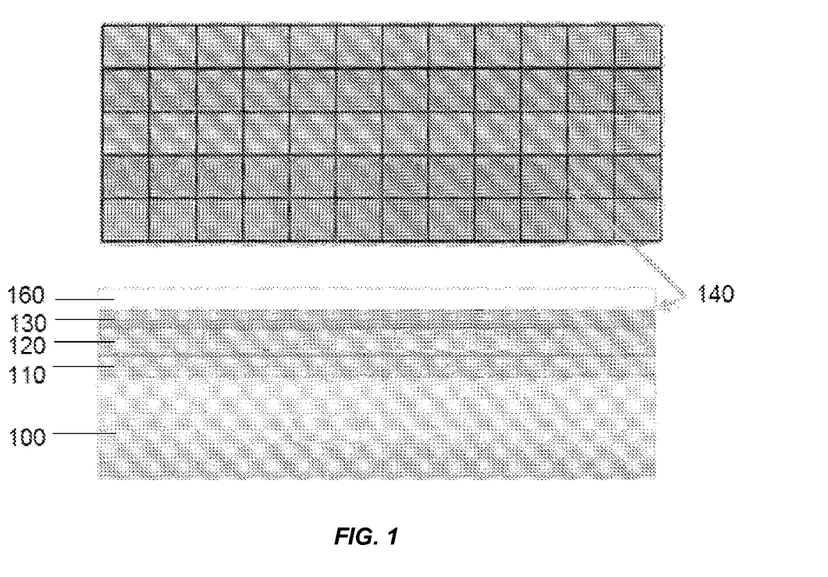
FIG. 1 is a schematic of an organic photosensitive device in accordance with the present disclosure.

Thus, as shown in FIG. 1, there is disclosed an organic photosensitive device comprising: a substrate 100; a first electrode 110 disposed over the substrate; a second electrode 130 disposed over the first electrode; a photoactive region 120 positioned between the first electrode and the second electrode; and at least one reflector 160 disposed over the second electrode, wherein the at least one reflector at least partially reflects one or more desired wavelengths. In some embodiments, the photoactive region transmits light at wavelengths in a transparent range.

In some embodiments, the photosensitive device exhibits a color corresponding to the one or more desired reflected wavelengths.

In some embodiments, the photosensitive device further comprises a metal grid 140 positioned between second electrode 130 and the reflector 160. The metal grid may be optimized to transmit as much incident light as possible while simultaneously minimizing series resistance in the device. In some embodiments, the metal grid comprises at least one material selected from stainless steel, platinum, palladium, titanium, and alloys thereof. In some embodiments, the metal grid has a transmissivity ranging from about 50% to about 99%. The metal grid may be deposited from a solution, a vapor, or a combination of both. In some embodiments, the metal grid is deposited by at least one technique chosen from vacuum deposition, silk screening, spincoating, dipcoating, spraycoating, chemical vapor deposition (CVD), laser ablation, physical vapor deposition, and sputtering.

Substrate 100 may comprise any surface capable of supporting the first electrode, the photoactive region, the second electrode, the reflector and any additional layers of the device. The substrate may be flexible, rigid, or semi-rigid, and may be planar or non-planar. The substrate may be transparent, translucent or opaque. Plastic, glass, and quartz are examples of rigid substrate materials. Plastic and metal foils are examples of flexible substrate materials. In certain embodiments, the glass comprises an architectural pane or automotive glass. In some embodiments the semi-rigid or flexible material comprises a moldable sheet that forms the final substrate or a plastic sheet that can be applied to a secondary surface. In certain embodiments, the substrate may be selected from motor vehicle bodies and components, watercraft bodies and components, aircraft bodies and components, spacecraft bodies and components, windows, mirrors, mobile devices, cell phones, computers, building surfaces, building sheetings, building sidings, roofing shingles, and rechargeable batteries.

Photoactive region 120 positioned between the first and second electrodes is the portion of the photosensitive device that absorbs electromagnetic radiation to generate excitons that may dissociate into an electron and a hole in order to generate an electrical current. The wavelengths of light absorbed by the photoactive region, i.e., excitonic absorption bands, and wavelengths of light transmitted by the photoactive region, i.e., transparent range, are determined by the types of materials comprising the photoactive region.

Photoactive region 120 comprises organic materials. In particular, photoactive region 120 comprises at least one donor material and at least one acceptor material to form at least one heterojunction. The dissociation of an exciton will typically occur at the "heterojunction" formed by the juxtaposition of donor and acceptor materials. In some embodiments, the heterojunction is chosen from a mixed heterojunction, a bulk heterojunction, a planar heterojunction, a nanocrystalline-bulk heterojunction, and a hybrid planar-mixed heterojunction. The donor and acceptor materials may be deposited by at least one technique chosen from, for example, vacuum deposition, spin coating, organic vapor-phase deposition (OVPD), inkjet printing, and vacuum thermal evaporation (VTE).

Suitable donor materials may include, for example, squaraines, phthalocyanines, napththalocyanines, porphyrins, subphthalocyanines, and derivatives or transition metal complexes thereof. In some embodiments, the donor material is chosen from subphthalocyanine (SubPc), copper pthalocyanine (CuPc), chloroaluminium phthalocyanine (ClAlPc), tin phthalocyanine (SnPc), zinc phthalocyanine (ZnPc), and other modified phthalocyanines, merocyanine dyes, boron-dipyrromethene (BODIPY) dyes, thiophenes, such as poly(3-hexylthiophene) (P3HT), pentacene, tetracene, diindenoperylene (DIP), and squaraine (SQ) dyes. In certain embodiments, the at least one donor material comprises 2,4-bis[4-(N,N-diphenylamino)-2,6-dihydroxyphenyl]squaraine (DPSQ).

Suitable acceptor materials may include, for example, polymeric or non-polymeric perylenes, naphthalenes, fullerenes (e.g., $C_{60}$ $C_{70}$, $C_{84}$), functionalized fullerene derivatives (e.g., PCBMs, ICBA, ICMA, etc.) and nanotubules. In some embodiments, the acceptor material is chosen from $C_{60}$, $C_{70}$, 3,4,9,10-perylenetetracarboxylicbis-benzimidazole (PTCBI), [6,6]-phenyl-C61-butyric acid methyl ester (PCBM), [6,6]-phenyl-C70-butyric acid methyl ester (PC70BM), and hexadecafluorophthalocyanine ($F_{16}$CuPc).

The "electrodes" described herein may be composed of "metal" or "metal substitutes." Herein, the term "metal" is used to embrace both materials composed of an elementally pure metal, e.g., Mg, and also metal alloys which are materials composed of two or more elementally pure metals, e.g., Mg and Ag together, denoted Mg:Ag. Herein, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). Another exemplary metal substitute is the transparent conductive polymer polyaniline (PANI) and its chemical relatives.

Metal substitutes may be further selected from a wide range of non-metallic materials, wherein the term "non-metallic" is meant to embrace a wide range of materials, provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes described herein may sometimes be referred to as "metal-free," wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents, they are "non-metallic" on several bases. They are neither pure free-metals nor are they alloys of free-metals. When metals are present in their metallic form, the electronic conduction band tends to provide, among other metallic properties, a high electrical conductivity as well as a high reflectivity for optical radiation.

Second electrode 130 should be transparent or at least semi-transparent to transmit light entering through the top of the device photoactive region 120. Second electrode 130 may be chosen, for example, from transparent oxides and metal or metal substitutes having a thickness sufficient to render them transparent or at least semi-transparent. In some embodiments, the second electrode comprises transparent conducting oxides, transparent conducting polymers, semi-transparent metals, or combinations thereof. In some embodiments, the transparent conducting oxides are chosen from indium tin oxide (ITO), tin oxide (TO), gallium indium tin oxide (GITO), zinc oxide (ZO), and zinc indium tin oxide (ZITO). In some embodiments, the transparent conducting polymers comprise polyanaline (PANI). Other exemplary electrodes include highly transparent, non-metallic, low resistance cathodes such as those disclosed in U.S. Pat. No. 6,420,031, to Parthasarathy et al., or a highly efficient, low resistance metallic/non-metallic compound electrode such as those disclosed in U.S. Pat. No. 5,703,436 to Forrest et al., both incorporated herein by reference for their disclosure of electrodes. Each type of electrode is typically prepared in a fabrication process that includes the step of sputter depositing, for example, an ITO layer onto either an organic material to form a highly transparent, non-metallic, low resistance electrode or onto a semi-transparent metal layer, such as an Mg:Ag layer, to form a highly efficient, low resistance metallic/non-metallic compound electrode.

One of the first and second electrodes may be an anode and the remaining electrode a cathode. The photosensitive devices of the present invention may be arranged such that a donor material is at the bottom of photoactive region 120

(closest to the substrate) or arranged such that a donor material is at the top of the photoactive region (furthest from the substrate). Thus, it should be understood that the electrodes must be optimized to allow for efficient injection of the desired carrier (holes if in contact with the donor, electrons if in contact with the acceptor).

Figure 2A:
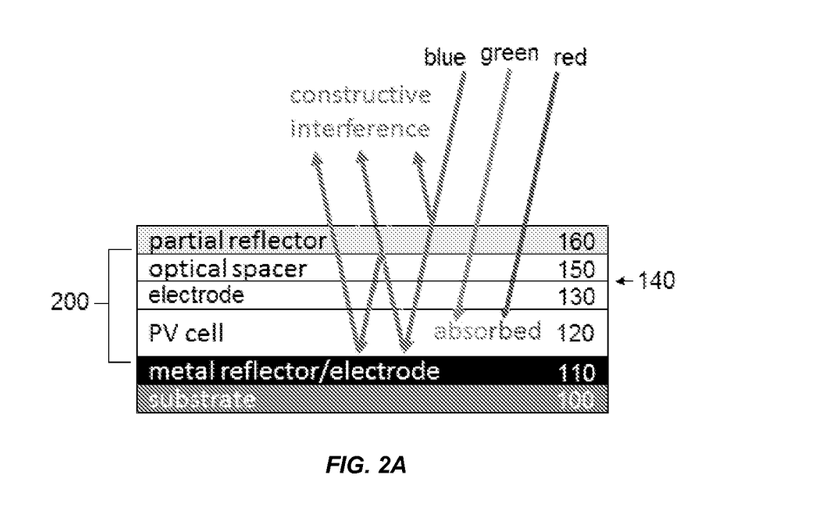
FIG. 2A is a schematic of an exemplary organic photosensitive device wherein the reflector 160 and the first electrode 110 define an optical microcavity 200.

In a first aspect of the present disclosure, reflector 160 and first electrode 110 define an optical microcavity 200 as shown in FIG. 2A. In this first aspect, first electrode 110 should be reflective. The first electrode may reflect ≥10% of incident light at one or more wavelengths, such as ≥20%, ≥30%, ≥40%, ≥50%, ≥60%, ≥70%, ≥80%, ≥90%, or about 100% of incident light at one or more wavelengths. In some embodiments, first electrode 110 comprises a metallic material. In certain embodiments, the metallic material is chosen from steel, Ni, Ag, Mg, Au, Ti, Sn, In, Al, and mixtures or alloys thereof.

Figure 2B:
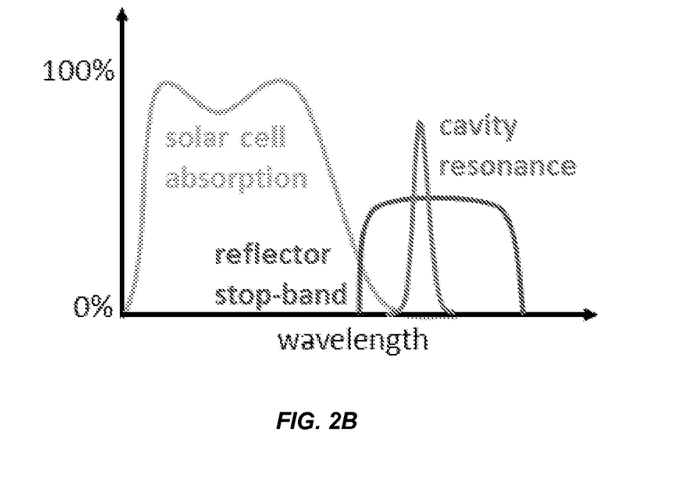
FIG. 2B is a graph showing the reflectivity of the reflector in the transparent range of the photoactive region, and the effect of cavity resonance on reflectivity.

According to the first aspect, reflector 160 is configured to partially reflect one or more desired wavelengths in the transparent range of the photoactive region. For example, for a green hue, 10% of the light between the wavelengths of 540 nm and 550 nm may be reflected, with no reflection at other wavelengths. The "transparent range" of the photoactive region is defined as the wavelengths at which the photoactive region exhibits a transmissivity greater than 50%, such as greater than 60%, greater than 70%, greater than 80%, or greater than 90%. As used herein, to "partially reflect" a wavelength means to reflect between about 10% and 50% of light at that wavelength, with the majority of the remaining percentage of light being transmitted. Reflector 160 can be configured and the materials of photoactive region 120 can be chosen such that the excitonic absorption bands have a minimum at the desired reflected wavelength (s) of the device. The reflector may exhibit little to no reflectivity, such as less than 5%, less than 4%, less than 3%, less than 2%, or less than 1%, at wavelengths absorbed by the photoactive region, e.g., at wavelengths where the photoactive region exhibits absorptivity greater than 30%, such as greater than 40%, greater than 50%, greater than 60%, or greater than 70%. In some embodiments, optical microcavity 200 includes an optical spacer 150 positioned between reflector 160 and second electrode 130, wherein the optical spacer has a thickness chosen to be resonant with the one or more desired wavelengths in the transparent range of the photoactive region or a subset thereof. The optical spacer may comprise a material chosen from any of many wide energy gap semiconductors, including organic molecules such as BCP, NPD, NTCDA, UGH2, CBP, etc., polymers such as PEDOT, polystyrene, etc., and doped variations of any of these materials, metal oxides such a $MoO_3$, indium tin oxide, $WO_3$, SnO, InO in any stoichiometric mixture, and inorganic semiconductors such as CdTe, AlAs, etc. As shown in an exemplary embodiment in FIG. 2A, reflector 160 substantially transmits wavelengths that are absorbed by the photoactive region (e.g., green and red spectrums) and partially reflects one or more desired wavelengths in the transparent range of the photoactive region (e.g., blue spectrum). The percentage of light at the one or more desired wavelengths not reflected by the reflector, i.e., partially transmitted by the reflector, passes through the photoactive region and is reflected to a desired degree by first electrode 110. As shown in FIG. 2A, this reflected light in the optical microcavity can constructively interfere, intensifying a desired reflected color. For example, in FIG. 2B, an intensification is observed at the resonance wavelengths of the cavity. The resonance should exist within the stop band wavelength range. Higher reflectance will cause narrower resonance (high Q) and purer color. That is, the Q is the quality factor and is the ratio of the peak height of the resonance to its width. The shaper the peak, therefore, the higher the Q. The cavities considered here need not be of the highest Q (Q approximately equal to 5 or higher is adequate for most practical purposes). However, the higher the Q, the more saturated the reflected color will appear. A higher saturation corresponds to a "purer" color appearance. Typically, to achieve high reflectance, the cavity optical length should be any integer multiple of the incident wavelength divided by four.

If substrate 100 is transparent, the device may be arranged in reverse such that light enters the device through the substrate. In this embodiment, reflector 160 may be positioned between the substrate and first electrode 110. Second electrode 130 may be reflective such that reflector 160 and second electrode 130 define an optical microcavity as described above. Optical spacer 150 and metal grid 140 may be positioned between reflector 160 and first electrode 110.

Any reflector capable of achieving the design characteristics described herein for the first aspect is contemplated by the present disclosure. In particular embodiments, reflector 160 is chosen from a DBR and a rugate reflector.

Figure 3:
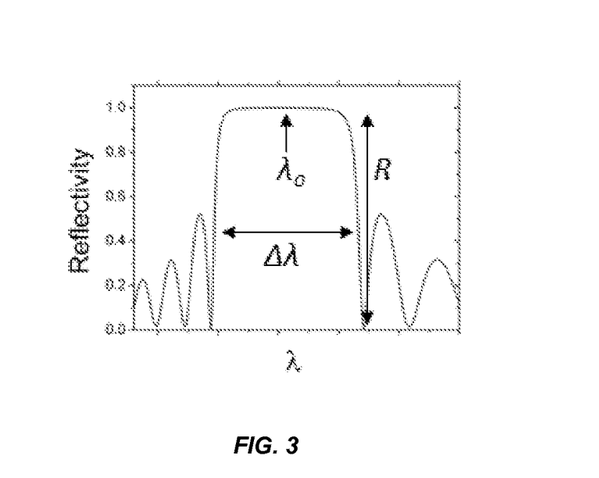
FIG. 3 is a plot of reflectivity versus wavelength for a sample DBR.

For example, as a DBR, reflector 160 may comprise a dielectric stack of alternating high- and low-refractive index (n) materials whose thicknesses (d) satisfy $\lambda_o=4n\times d$, where $\lambda_o$ is the center reflected wavelength. The materials may comprise organic or inorganic materials chosen from organic and inorganic polymers, organic small molecules, oxides, nitrides, and oxynitrides. The organic and inorganic polymers may be silicon-containing polymers. The oxides and nitrides may be chosen, for example, from glassy dielectrics such as $SiN_x$, $SiO_2$, $TiO_2$, etc. Reflectivity for a desired center wavelength ($\lambda_o$) in FIG. 3 can be approximated by:

$$R = \left[\frac{n_o(n_{high})^{2N} - n_s(n_{low})^{2N}}{n_o(n_{high})^{2N} + n_s(n_{low})^{2N}}\right]^2$$

$n_{high/low}$- high/low refractive index $n_{o/s}$- incident/substrate refractive index $N$- number of pairs The width of the reflection stop-band can be estimated by:

$$\Delta\lambda = \frac{4\lambda_o}{\pi}\arcsin\left(\frac{n_{high} - n_{low}}{n_{high} + n_{low}}\right)$$

The width of the reflection stop-band can be controlled by the index contrast of the materials. Reflectivity is determined by the index contrast of the materials and the number of alternating pairs (N) of materials. Device color can change depending on the observation angle (iridescent). Using higher refractive index materials results in less angular color shit and allows for thinner dielectric stacks.

Alternatively, as a rugate reflector, reflector 160 may comprise a blend of two or more materials at varying mixing ratios or at least one material at varied packing density to achieve a continuously varying refractive index throughout the material, such as a sinusoidally varying refractive index profile. At a position (z) perpendicular to the plane of the rugate reflector, the refractive index may be calculated as follows:

$$n(z) = n_o + \frac{\Delta n}{2} \sin\left(\frac{4\pi}{\lambda_o} z\right)$$

z-position perpendicular to plane $n_o$- average index $\Delta n$- index modulation amplitude $\lambda_o$- center wavelength The modulation period is determined by a desired center wavelength ($\lambda_o$). The index modulation amplitude controls the width of the reflection stop-band. The number of periods determines the reflectivity. Envelope functions can be applied to the index modulation to eliminate side-lobes appearing on the sides of the reflection stop-band.

In some embodiments of the first aspect, the reflector comprises nanoparticles comprised of metal or dielectrics, or nanostructures embedded in a dielectric layer. Nanoparticles and/or nanostructures may be used to tune the microcavity. For example, they can change the refractive index, and hence the center wavelength of the cavity. Or, in the case of metals, they can create plasma resonances that alter the optical mode within the cavity itself. This optical mode will resonate (i.e. have a transmission or reflection maximum and peak width) at wavelengths different from that of the same cavity lacking such particles or structures.

Figure 4A:
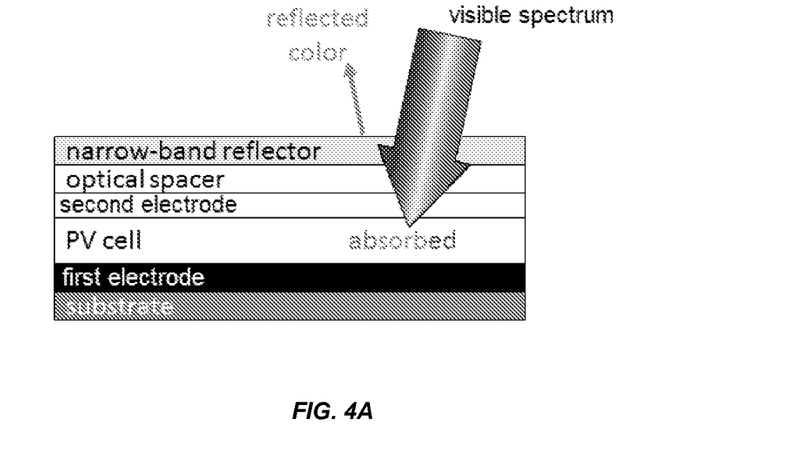
FIG. 4A is a schematic of an exemplary organic photosensitive device having at least one notch filter.
Figure 4B:
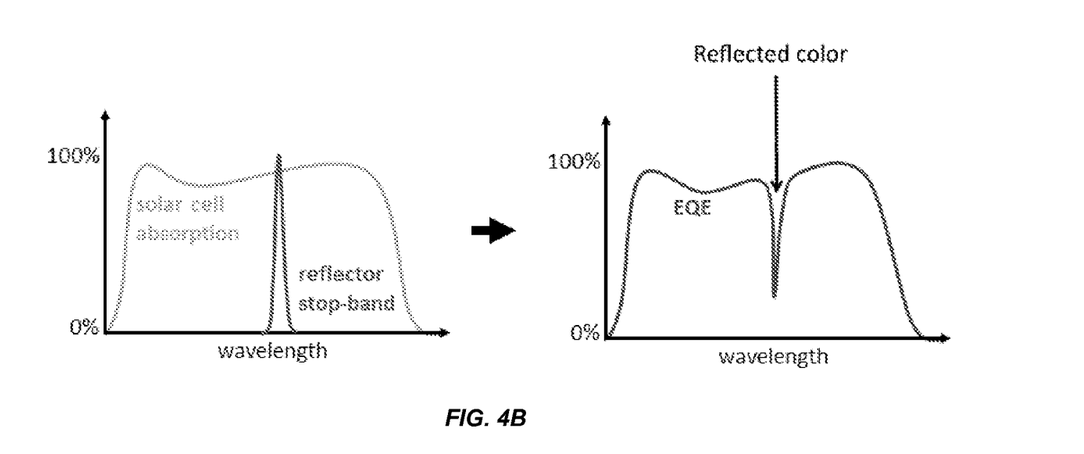
FIG. 4B shows a photoactive region absorption spectrum and a narrow reflection band for a photosensitive device having at least one notch filter. The resulting external quantum efficiency (EQE) is also shown with a sharp downward spike in EQE observed at the narrow reflection band (reflected color) of the notch filter.

In a second aspect of the present disclosure, reflector 160 in FIG. 1 comprises at least one notch filter configured to exhibit high reflectivity in a narrow reflection band at a range of one or more desired wavelengths. The device may exhibit a color corresponding to the range of one or more desired wavelengths. As used herein, the term "narrow reflection band" means a reflection band having a width no greater than 5% of the central reflected wavelength (i.e. in the green at a central wavelength of 550 nm, a narrow band would be less than 28 nm). As shown in FIG. 4A, the device may further comprise an optical spacer positioned between the narrow-band reflector and the second electrode. The optical spacer can be used to optimize performance of the organic photosensitive device. In FIG. 4A, most of the visible spectrum is transmitted through the narrow-band reflector for absorption in the photoactive region (PV cell). A narrow reflection band at a range of one or more desired wavelengths results in the device exhibiting a desired (reflected) color. Because the reflection band of the notch filter is narrow, the notch filter can be used to reflect any desired wavelength(s). That is, there are no restrictions on where the notch filter must reflect or where the photoactive region must absorb. For example, as shown in FIG. 4B, a device comprising at least one notch filter exhibits high reflectivity in a narrow wavelength range. The photoactive region can absorb across a wide range of wavelengths with only a small reduction in efficiency occurring at the narrow reflection band (reflected color) of the notch filter.

Any notch filter capable of achieving a narrow reflection band at a range of one or more desired wavelengths is contemplated by the present disclosure. In particular embodiments, the at least one notch filter is chosen from a DBR and a rugate reflector. The DBR or rugate reflector can be configured based on the parameters identified above for those reflectors to exhibit a narrow reflection band at a range of one or more desired wavelengths.

Figure 5:
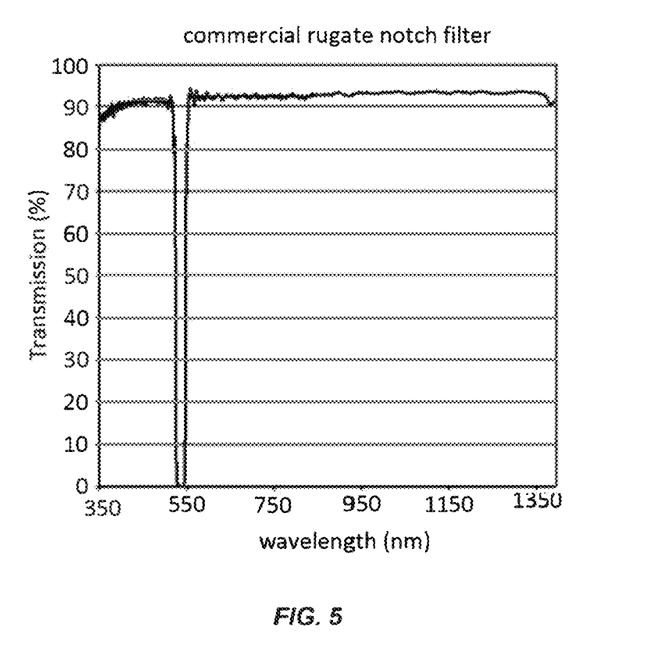
FIG. 5 is a plot of transmission (%) versus wavelength for a sample rugate reflector acting as a notch filter.

FIG. 5 shows a sample plot of the transmission of a rugate reflector acting as a notch filter. As shown, the notch filter transmits above 90% at nearly all plotted wavelengths. A narrow reflection band is observed at just under a wavelength of 550 nm.

In the second aspect of the present disclosure, the first electrode may comprise a metal substitute, a non-metallic material, or a metallic material. The first electrode need not be reflective. A reflective first electrode, however, can reflect light into the photoactive region to increase the amount of radiation absorbed by the photoactive region. Thus, in some embodiments of the second aspect, the first electrode comprises a metallic material. The metallic material may be chosen, for example, from steel, Ni, Ag, Mg, Au, Ti, Sn, In, Al, and mixtures or alloys thereof.

In some embodiments of the second aspect, two or more notch filters are used in conjunction to create a series of narrow reflection bands at desired wavelengths. Thus, in some embodiments, the reflector comprises at least a first notch filter and a second notch filter, wherein the first notch filter is configured to exhibit high reflectivity in a narrow reflection band at a range of one or more first desired wavelengths, and the second notch filter is configured to exhibit high reflectivity in a narrow reflection band at a range of one or more second desired wavelengths. In this embodiment, the organic photosensitive device may exhibit a color corresponding to the one or more first desired wavelengths and the one or more second desired wavelengths. In particular embodiments, the first and second notch filters are independently chosen from DBRs and rugate reflectors. Alternatively, as one of ordinary skill in the art would appreciate, a single rugate reflector having a more complex refractive index profile may result in a series of reflection stop-bands.

As before, if substrate 100 is transparent, the device may be arranged in reverse such that light enters the device through the substrate. In this embodiment, reflector 160 comprising at least one notch filter may be positioned between the substrate and first electrode 110. An optical spacer and a metal grid may be positioned between reflector 160 and first electrode 110.

Figure 6:
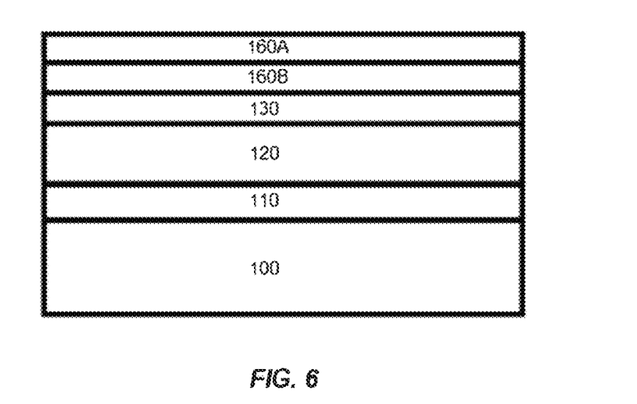
FIG. 6 shows a non-limiting device schematic having at least two reflectors: a first reflector 160A and a second reflector 160B, where the first reflector comprises at least one notch filter, and the second reflector and the first electrode 110 define an optical microcavity.

In a third aspect, multiple reflectors are used in conjunction such that reflector 160 in FIG. 1 comprises at least a first reflector and a second reflector. The first reflector may comprise at least one notch filter, the at least one notch filter configured to exhibit high reflectivity in a narrow reflection band at a range of one or more first desired wavelengths. The second reflector and the first electrode may define an optical microcavity, wherein the first electrode reflects ≥10% of incident light at one or more wavelengths, such as ≥20%, ≥30%, ≥40%, ≥50%, ≥60%, ≥70%, ≥80%, ≥90%, or about 100% of incident light at one or more wavelengths. The second reflector is configured to partially reflect one or more second desired wavelengths in the transparent range of the photoactive region. The second reflector can be configured and the materials of the photoactive region can be chosen such that the excitonic absorption bands have a minimum at the one or more second desired wavelengths. The second reflector may exhibit little to no reflectivity, such as less than 5%, less than 4%, less than 3%, less than 2%, or less than 1%, at wavelengths absorbed by the photoactive region, e.g., at wavelengths where the photoactive region exhibits absorptivity greater than 30%, such as greater than 40%, greater than 50%, greater than 60%, or greater than 70%. The narrow reflection band at the range of one or more first desired wavelengths should not substantially overlap with the one or more second desired wavelengths partially reflected by the second reflector. In some embodiments, the narrow reflection band at a range of one or more first desired wavelengths does not overlap with the one or more second desired wavelengths partially reflected by the second reflector. In some embodiments, the first reflector 160A is positioned over the second reflector 160B, as shown in FIG. 6.

In some embodiments of the third aspect, the optical microcavity includes an optical spacer positioned between the second reflector and the second electrode, wherein the optical spacer has a thickness chosen to be resonant with the one or more second desired wavelengths or a subset thereof. In some embodiments, the organic photosensitive device exhibits a color corresponding to the one or more first desired wavelengths, and the one or more second desired wavelengths or a subset thereof.

Any reflectors capable of achieving the design characteristics described herein for the third aspect are contemplated by the present disclosure. In particular embodiments, the reflectors are independently chosen from DBRs and rugate reflectors. The DBR and/or rugate reflectors can be configured, based on the parameters identified above for those reflectors, to exhibit a narrow reflection band at a range of one or more first desired wavelengths and/or to partially reflect one or more second desired wavelengths in the transparent range of the photoactive region.

As before, if substrate 100 is transparent, the device may be arranged in reverse such that light enters the device through the substrate. In this embodiment, reflector 160 may be positioned between the substrate and first electrode 110. Second electrode 130 may be reflective such that the second reflector and the second electrode define an optical microcavity as described above. Optical spacer 150 and metal grid 140 may be positioned between the second reflector and the first electrode.

The reflectors of the present disclosure can simultaneous function as an encapsulating layer for a photosensitive device, protecting the underlying active organic material from exposure to air and from mechanical damage from particles. Alternatively, a dedicated encapsulating layer may be added on top of the reflector(s) to protect the device.

In some embodiments, the devices of the present invention may further comprise an antireflective dielectric coating for incident light in the excitonic absorption bands of the photoactive region. The antireflective dielectric coating may be engineered into the reflector(s) or can be a separate coating disposed above the reflector(s). The anti-reflection coating may be configured to exhibit an optical pass-band at wavelengths of interest. Broad-band anti-reflection coatings that pass a large fraction of incident wavelengths may include only one or two layers in composition, whereas sharp wavelength filters may require more layers (e.g., 5-50), depending on the sharpness of the desired spectral pass or cut-off bands.

In any of the embodiments described herein, the reflector(s) may comprise one or more organic or inorganic dielectric materials chosen from organic and inorganic polymers, organic small molecules, oxides, nitrides, and oxynitrides. In some embodiments, the organic and inorganic polymers comprise silicon-containing polymers. In some embodiments, the oxides and nitrides are chosen from $SiN_x$, $SiO_2$, and $TiO_2$.

The photosensitive devices of the present disclosure may further comprise one or more blocking layers, such as an exciton blocking layer (EBL). The one or more blocking layers may be located between the first and second electrodes. In some embodiments, one or more blocking layers are located between one or both of the first electrode and the photoactive region and the second electrode and the photoactive region. With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl) benzene (TPBi), tris(acetylacetonato) ruthenium(III) (Ru (acac)$_3$), and aluminum(III)phenolate (Alq$_2$ OPH), N,N'-diphenyl-N,N'-bis-alpha-naphthylbenzidine (NPD), aluminum tris(8-hydroxyquinoline) (Alq$_3$), and carbazole biphenyl (CBP).

Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

The photosensitive devices of the present disclosure may further comprise at least one smoothing layer located between the substrate and the reflector(s). In some embodiments, the at least one smoothing layer is located between the substrate and the metal grid. In some embodiments, the at least one smoothing layer comprises a film of 3,4-polyethylenedioxythiophene:polystyrenesulfonate (PEDOT:PSS). At least one smoothing layer may be located between the first electrode and the photoactive region or the second electrode and the photoactive region and may lead to improved fabrication yields. Without being bound to a particular theory, it is believed that the improved fabrication yields may be a result of the ability of the spin-coated PEDOT:PSS film to planarize an electrode, such as ITO, whose rough surface could otherwise result in shorts through the thin molecular layers.

The organic photosensitive devices of the present disclosure may function as a PV device, such as a solar cell, a photodetector or a photoconductor. Whenever the organic photosensitive optoelectronic devices described herein function as a PV device, the materials used in the photoconductive organic layers and the thicknesses thereof may be selected, for example, to optimize the external quantum efficiency of the device. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

Another aspect of the present disclosure is a method of fabricating the organic photosensitive devices of the present disclosure. In one embodiment, the method comprises depositing a first electrode over a substrate; depositing a photoactive region over the first electrode; depositing a second electrode over the photoactive region; and depositing at least one reflector over the second electrode, wherein the at least one reflector is configured to at least partially reflect one or more desired wavelengths.

In the methods of the present disclosure, the reflector(s) may be configured to exhibit the design characteristics described herein in the different aspects of the disclosure.

Similarly, donor and acceptor materials may be chosen to exhibit the design characteristics described herein.

In some embodiments, the method further comprises depositing a metal grid over the second electrode prior to depositing the at least one reflector.

In some embodiments, the method further comprises depositing at least one smoothing layer on the substrate prior to depositing the first electrode.

In some embodiments, the method further comprises depositing at least one blocking layer over the first electrode prior to depositing the photoactive region. In some embodiments, the method further comprises depositing at least one blocking layer over the photoactive region prior to depositing the second electrode. In some embodiments, the method further comprises depositing at least one blocking layer over the first electrode prior to depositing the photoactive region, and depositing at least one blocking layer over the photoactive region prior to depositing the second electrode.

The electrodes, photoactive region, metal grid, reflector materials, optical spacer materials and additional organic or inorganic layers as described herein may be deposited from a solution, vapor, or a combination of both.

In some embodiments, the electrodes and/or the at least one reflector is deposited by at least one technique chosen from spincoating, dipcoating, spraycoating, chemical vapor deposition (CVD), laser ablation, physical vapor deposition, and sputtering.

As described herein the devices of the present invention may be prepared through growth on a variety of substrates to form power-generating coatings. The power-generating coatings may be used, for example, as paints, shades, or protection layers, and may take the form, for example, of a film or foil.

The specific materials and structures described are exemplary in nature, and other materials and structures may be used. Functional organic photosensitive optoelectronic devices may be achieved by combining the various layers described in different ways, or layers may be omitted entirely, based on design, performance, and cost factors. Other layers not specifically described may also be included. Materials other than those specifically described may be used. It should be understood that the layers of the device as described herein may comprise combinations of materials, such as a mixture of host and dopant, or more generally a mixture. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

What is claimed is:

1. An organic photosensitive device comprising:
   a substrate;
   a first electrode disposed over the substrate;
   a second electrode disposed over the first electrode;
   a photoactive region positioned between the first electrode and the second electrode comprising an organic donor material and an organic acceptor material;
   a reflector comprising a first reflector and a second reflector, wherein the second reflector is disposed over the second electrode, the second reflector and the first electrode define an optical microcavity, and the first reflector comprises at least one notch filter configured to exhibit reflectivity at a range of one or more wavelengths of incident light,
   wherein the reflectivity includes reflectivity greater than 30%,
   wherein the at least one notch filter comprises a reflection band,
   wherein the reflection band has a width no greater than 5% of a reflected wavelength of the range of one or more wavelengths of incident light,
   wherein the reflector is configured to partially reflect one or more wavelengths in a transparent range of the photoactive region,
   wherein the device has an inverted structure,
   wherein the device exhibits a color corresponding to the range of one or more wavelengths; and
   wherein the optical microcavity comprises a metal grid and an optical spacer, wherein each of the metal grid and the optical spacer is positioned between the second electrode and the second reflector, wherein a thickness of the optical spacer is resonant with the reflected wavelength of the range of one or more wavelengths of incident light.

2. The device of claim 1, wherein the at least one notch filter is chosen from a distributed Bragg reflector (DBR) and a rugate reflector.

3. The device of claim 1, wherein the at least one notch filter comprises one or more dielectric materials chosen from organic and inorganic polymers, organic small molecules, oxides, nitrides, and oxynitrides.

4. The device of claim 1, wherein the substrate comprises a flexible material.

5. The device of claim 1, wherein the substrate comprises an architectural pane or automotive glass.

6. The device of claim 4, wherein the flexible material comprises a moldable sheet that forms the substrate or a plastic sheet that can be applied to a secondary surface.

7. The device of claim 1, wherein the substrate is selected from motor vehicle bodies and components, watercraft bodies and components, aircraft bodies and components, spacecraft bodies and components, windows, mirrors, mobile devices, cell phones, computers, build surfaces, building sheetings, building sidings, roofing shingles, and rechargeable batteries.

8. The device of claim 1, wherein the device is an organic solar cell.

9. An organic photosensitive device comprising:
   a substrate;
   a first electrode disposed over the substrate;
   a second electrode disposed over the first electrode;
   a photoactive region positioned between the first electrode and the second electrode comprising an organic donor material and an organic acceptor material;
   a reflector disposed over the second electrode,
   wherein the reflector comprises a first reflector and a second reflector, wherein the second reflector is disposed over the second electrode, the second reflector and the first electrode define an optical microcavity, and the first reflector comprises at least a first notch filter and a second notch filter,
   wherein at least one of the first notch filter or the second notch filter are a distributed Bragg Reflector (DBR),
   wherein the first notch filter is configured to exhibit reflectivity at a range of one or more first wavelengths of incident light, and the second notch filter is configured to exhibit reflectivity at a range of one or more second wavelengths of incident light, and wherein the reflectivity includes reflectivity greater than 30%,
   wherein the first notch filter comprises a first reflection band and the second notch filter comprises a second reflection band,
   wherein the one or more second wavelengths are different from the one or more first wavelengths, and wherein the first and second reflection bands each have a width no greater than 5% of their respective reflected wavelengths of the range of one or more of their respective wavelengths of incident light, wherein the reflector is configured to partially reflect one or more wavelengths in a transparent range of the photoactive region, wherein the device has an inverted structure, wherein the device exhibits a color corresponding to the range of one or more first wavelengths and the range of one or more second wavelengths; and wherein the optical microcavity comprises a metal grid and an optical spacer, wherein each of the metal grid and the optical spacer is positioned between the second electrode and the second reflector, wherein a thickness of the optical spacer is resonant with the reflected wavelength of the range of one or more second wavelengths of incident light.

10. The device of claim 9, wherein the first and second notch filters are independently chosen from distributed Bragg reflectors (DBRs) and rugate reflectors.

11. The device of claim 9, wherein the first notch filter comprises one or more dielectric materials chosen from organic and inorganic polymers, organic small molecules, oxides, nitrides, and oxynitrides, and the second notch filter comprises one or more dielectric materials chosen from organic and inorganic polymers, organic small molecules, oxides, nitrides, and oxynitrides.

* * * * *